(12) United States Patent
Dai et al.

(10) Patent No.: US 9,766,154 B2
(45) Date of Patent: Sep. 19, 2017

(54) MULTI FIELD POINT ABERRATION PARALLEL METROLOGY DEVICE AND METHOD FOR LITHOGRAPHIC PROJECTION LENS

(71) Applicant: Shanghai Institute of Optics And Fine Mechanics, Chinese Academy of Sciences, Shanghai (CN)

(72) Inventors: Fengzhao Dai, Shanghai (CN); Xiangzhao Wang, Shanghai (CN); Feng Tang, Shanghai (CN); Yazhong Zheng, Shanghai (CN)

(73) Assignee: Shanghai Institute of Optics and Fine Mechanics, Chinese Academy of Sciences, Shanghai (CN)

( * ) Notice: Subject to any disclaimer, the term of this patent is extended or adjusted under 35 U.S.C. 154(b) by 86 days.

(21) Appl. No.: 14/984,577

(22) Filed: Dec. 30, 2015

(65) Prior Publication Data
US 2017/0131176 A1     May 11, 2017

(30) Foreign Application Priority Data
Nov. 9, 2015 (CN) .......................... 2015 1 0757427

(51) Int. Cl.
*G01M 11/02* (2006.01)
*G03F 7/20* (2006.01)

(52) U.S. Cl.
CPC ......... *G01M 11/0271* (2013.01); *G03F 7/706* (2013.01)

(58) Field of Classification Search
CPC .......... G01M 11/0271; G01M 11/0207; G01B 9/02098; G03F 7/706; G03F 7/20
See application file for complete search history.

(56) References Cited

U.S. PATENT DOCUMENTS

| | | | |
|---|---|---|---|
| 6,573,997 B1 * | 6/2003 | Goldberg | G01M 11/0264 356/515 |
| 2002/0001088 A1 | 1/2002 | Wegmann et al. | |
| 2006/0001890 A1 | 1/2006 | Poultney | |

(Continued)

OTHER PUBLICATIONS

Falldorf, C., et al., "Liquid crystal spatial light modulators in optical metrology," J. Information Optics (WIO), 2010: 1-3.

(Continued)

*Primary Examiner* — Jonathan Hansen
(74) *Attorney, Agent, or Firm* — Mei & Mark LLP; Manni Li (57) ABSTRACT

A multi field point aberration parallel detection device for a lithographic projection lens and a detection method therefor, having a spatial light modulator that is respectively arranged on the object plane and the image plane of the projection lens under test, wherein the object plane spatial light modulator and the image plane spatial light modulator are respectively disposed as an object plane grating set comprising multiple one-dimensional gratings and an image plane grating set comprising multiple two-dimensional gratings via computer programming. The gratings in the object plane grating set and the image plane grating set are conjugate one to another in respect of the projection lens under test, with each pair of conjugate grating being measured for the wave aberration of a field point.

4 Claims, 7 Drawing Sheets

(56) References Cited

U.S. PATENT DOCUMENTS

2015/0286153 A1  10/2015  Kok et al.

OTHER PUBLICATIONS

Malacara, Z., et al., "Interferogram analysis for optical testing," M. CRC Press, 2005, pp. 267-276.
Dai, F., et al., "Modal wavefront reconstruction based on Zernike polynomials for lateral shearing interferometry: comparisons of existing algorithms," J. Applied Optics, 2012, 51(21): 5028-5037.

* cited by examiner

MULTI FIELD POINT ABERRATION PARALLEL METROLOGY DEVICE AND METHOD FOR LITHOGRAPHIC PROJECTION LENS

CROSS-REFERENCE TO RELATED APPLICATIONS

The subject application claims priority on Chinese patent applications CN 201510757427.0 filed on Nov. 9, 2015. The contents and subject matter of the Chinese priority application is incorporated herein by reference.

FIELD OF INVENTION

The present invention belongs to lithography, particularly, a aberration metrology method for a lithographic projection lens, and more particularly, a multi field point aberration parallel metrology device and method for a lithographic projection lens.

BACKGROUND ART

Very large scale integrated circuit (VLSIC) is reputed as the industrial fodder for the importance in modern world. The lithographic tool is the kernel piece of the equipment for the VLSIC manufacture, and its progress directly enables the decrease in size of the VLSIC and increase in integration scale; whether the feature size of the integrated circuit (IC) continues to decrease follow the "Moore's Law" is dependent on the development of lithography technology. The history of the continual decrease in the feature size of the IC is also a history of the continual evolution of lithographic tools. Lithographic exposure wavelength continues to decrease from the g line (436 nm) and I line (365 nm) of a mercury lamp to the 248 nm and 193 nm of an excimer laser. The exposure mode of a lithographic tool has experienced three stages: contact lithography, proximity lithography, and optical projection lithography, with projection lithography being the exposure mode for almost all high-end lithographic tools nowadays. The projection lens system is the kernel sub-system of a projection lithographic tool and the key to lithographic resolution. While the aberration is a major property parameter for a projection lens, the smaller the aberration, the better the imaging quality. A lithographic projection lens has an optical component for adjusting aberration, and the basis for adjustment is dependent on measurement result of aberration of the projection lens. Hence, the level of control of aberration of a projection lens relates directly to the measurement precision of aberration.

A 193 nm projection lens has combined with multi patterning techniques in realizing scale production of 14 nm node integrated circuits, and is very likely to extend to 10 nm node and 7 nm node. To increase lithographic production rate, the power of the light source continues to increase, and under the multi pole or free form illumination; thermal effect of the projection lens ever increases, and the issue of thermal aberration is getting evermore prominent. To control the imaging quality more precisely, the measurement of the aberration of the projection lens shifts from lot-by-lot measurement to wafer by wafer measurement. In order not to decrease the production rate, the measuring speed of aberration has to increase. Aberration of a projection lens is field point related, that is, different field points have different aberration, and thus measurement of wave aberration data for multi field points is required. To increase measurement speed, multi field point parallel detection can be adopted.

Shearing interferometer is structurally simple, requires no reference wave, is easy to integration, and thus employed as an in situ detection technique for aberration. DE 10008181 discloses a shear interferometer for lithographic aberration detection, where a one-dimensional grating is disposed on an object plane of a projection lens, and a two-dimensional grating is disposed on an image plane thereof; the object plane one-dimensional grating modulates spatial coherence of the optical field, while the image plane two-dimensional grating is employed for shearing the wavefront under test, with a detector arranged in a defocusing position for obtaining an interferogram of the under test wavefront and the sheared wavefront. Such a method generates the phase shift by means of mechanically moving the object plane grating or the image plane grating; in the case of generating phase shift by means of moving the object plane grating, the position of the measured field point moves as the grating moves; in the case of generating phase shift by means of moving the image plane grating, the measured pupil position deviates; regardless whether it is the position of the measured field point or the pupil position which deviates, a measurement error results. In addition, such a method needs to replace the grating for a different grating line direction when shear direction is changed.

U.S. Patent Application Publication 2006/0001890 A1 discloses an improved shear interferometer for aberration detection of a lithographic projection lens by adopting a spatial light modulator on the object plane as an object plane grating generator. Phase shift is generated by means of digitally moving the gratings of the spatial light modulator, thus avoiding the issue of the moving of the detected field points; in addition, digitally changing the grating line direction of the gratings of the object plane spatial light modulator is more convenient than replacing gratings. For a specific detected wavefront and a projection lens, the shear ratio is dependent on the image plane gratings, thus DE 10008181 and U.S. Patent Application Publication 2006/0001890 A1 both require to replace the image plane gratings in order to change shear ratio. Aberration detection is sensitive to different shear ratio, and therefore there is a need in aberration detection to change shear ratio.

WO 2014/060149 A1 discloses a multi channel parallel detection shear interferometer for multi field point aberration parallel detection for a lithographic projection lens. A grating board comprising n groups of gratings is disposed on the object plane of the projection lens, where n is the number of parallel detection field points, with each group of gratings comprising two one-dimensional gratings, the grating line direction thereof being perpendicular to one another, for two shear measurements on two mutually orthogonal directions; a grating board comprising n two-dimensional chessboard gratings is disposed on the image plane, the diagonal directions of the chessboard grating being parallel to the grating line directions of the one-dimensional gratings on the object plane. In actual detection, adjust the object plane gratings and the image plane gratings so that their positions satisfying an object-image relationship, with n detectors being placed on a defocusing position under the image plane gratings for reception of the wavefront shear interferogram of each field point. The method requires mechanically moving the object plane gratings or the image plane gratings to generate phase shift, as well requires mechanically moving the grating boards to replace gratings in the other direction for changing shear directions Because shear ratio is restricted by the period of the image plane gratings, so the object plane gratings and the image plane gratings need to be changed at the mean time to change shear ration.

SUMMARY OF THE INVENTION

The present invention overcomes the afore-mentioned deficiencies by providing a multi field aberration parallel detection device for a lithographic projection lens and a detection method therefor. The present invention realizes the parallel detection of multi field point aberration for a lithographic projection lens with increased versatility and detection precision of the detection system.

The present invention provides a multi field point aberration parallel detection device for a lithographic projection lens, comprising:

a light source and an illumination system, a reticle stage, a wafer stage and a two-dimensional photodetector disposed successively along an optical route of the light source; its characteristic is that an object plane spatial light modulator is arranged on the reticle stage which moves the object plane spatial light modulator along therewith; an image plane spatial light modulator is arranged on the wafer stage which moves the image plane spatial light modulator along therewith; the object plane spatial light modulator, the image plane spatial light modulator, and the two-dimensional photodetector are respectively connected with a computer; the object plane spatial light modulator is disposed by the computer as an object plane grating set comprising n object plane gratings (the method of disposal is described in Falldorf C. et al., Liquid crystal spatial light modulators in optical metrology, J. Information Optics (WIO), 2010: 1-3, and US 2006/0001890 A1, the relevant proportions are incorporated herein by reference), where n is a positive integer representing the number of the parallel detection field points; the image plane spatial light modulator is disposed by the computer as an image plane grating set comprising n image plane gratings; where the object plane gratings in the object plane grating set are one-dimensional gratings, the image plane gratings in the image plane grating set are two-dimensional chessboard gratings or two-dimensional cross gratings, and the object plane gratings in the object plane grating set are arranged in an identical manner as the image plane gratings are in the image plane grating set. The object plane spatial light modulator and the image plane spatial light modulator are either transmissive amplitude-only spatial light modulators or transmissive phase spatial light modulators.

The present invention further provides a method of parallel detection for multi field point aberration of a lithographic projection lens employing the afore-mentioned multi field points aberration parallel detection device for a lithographic projection lens comprises the following steps:

(1) adjusting the optical route for detection:

adjusting the reticle stage so that the object plane spatial light modulator thereon is on an object plane of an under-test projection lens, and adjusting the wafer stage so that the image plane spatial light modulator thereon is on an image plane of the under-test projection lens; adjusting the reticle stage and the wafer stage so that the object plane gratings in the object plane grating set and the image plane gratings in the image plane grating set are in an relation of object and image;

(2) shear measuring:

determining at least two shear directions according to the detection requirement of the aberration of the lithographic projection lens, adjusting the object plane gratings in the object plane grating set via the computer so that the direction of the grating line of the object plane gratings is perpendicular to the measuring direction under test; opening the light source; detecting shear interferograms corresponding to each image plane shear interference grating on the image plane grating set via the photodetector; and transmitting the interferograms to the computer for storage, adjusting via the computer so that the grating line of the object plane gratings of the object plane grating set or of the image plane gratings of the image plane grating set moves along the measuring direction under test (the method of adjustment is described in Falldorf C et al., Liquid crystal spatial light modulators in optical metrology, J. Information Optics (WIO), 2010: 1-3, and US 2006/0001890 A1, the relevant proportions are incorporated by reference), to generate a phase shift; detecting shear interferograms corresponding to each image plane grating via the photodetector, and transmitting to the computer for storage for each phase shift;

the shear interferogram transmitted to the computer for storage is a data of light intensity, the shear interferogram for each shear measuring direction, for each field point, and for each phase shift is represented by $I_{jkl}$, wherein sub-indexes j, k, and l being positive integers, and representing respectively a jth measuring direction, a kth field point, and an lth phase shift, and $I_{jkl}$ representing a shear interferogram of the jth measuring direction, the kth field point, and the lth phase shift; the value of j is generally 1 or 2, that is, shear measuring is conducted in two mutually perpendicular directions, albeit it might be conducted multiple times in multiple non mutually perpendicular directions in a plane; k ranges from 1-n, and the range of l depends on the adopted phase shift algorithm;

the measuring direction under test is any direction in an xy plane, and has at least two directions, wherein the xy plane is a horizontal plane of a coordinate system of the lithographic tool;

(3) data processing:

obtaining a phase data $\theta_{jk}$ for each field point and each shear direction by means of a phase extracting algorithm (See Malacara Z et al., Interferogram analysis for optical testing, M. CRC Press, 2005) on each shear interferogram for each shear direction and each image shear direction via the computer, and obtaining a aberration data $W_j$ (j=1, 2, ..., n) for each field point via the phase data for all the shear directions of each field point by means of a wavefront reconstruction algorithm (See Dai F et al., Modal wavefront reconstruction based on Zernike polynomials for lateral shearing interferometry: comparisons of existing algorithms, J. Applied Optics, 2012, 51(21): 5028-5037; Malacara Z et al., Interferogram analysis for optical testing, M. CRC Press, 2005) for shear interference, and thus obtaining the aberration data $W_j$ for all the parallel detection field points of the projection lens.

The gratings in the object plane grating set and the image plane grating set are conjugate one to another in respect of the projection lens under test, with each pair of conjugate grating being measured for the aberration of a field point. Via computer programming, the period and the grating line direction of the object plane grating and the image plane grating are controlled, change of shear direction and adjustment of shear ratio are realized without replacing or mechanically moving any component, and thus system flexibility is enhanced; phase shift is realized by means of controlling grating line movement of the object plane grating or the image plane grating via computer programming, thus the problem of pupil position displacement or field point position deviation arising from phase shift via mechanically moving the gratings is avoided, and measurement precision is improved.

The principle of the present invention is as follows: a spatial light modulator is respectively employed on the object plane and the image plane, and the spatial light modulators are disposed via computer programming as grating sets wherein the number of gratings in each grating set is the number of parallel detection field points, and the grating period, the direction of the grating line, and the distance between gratings for all gratings in the grating set are all adjustable via computer programming, so that change of shear direction and adjustment of shear ratio are realized without replacing or mechanically moving any component, and thus system flexibility is enhanced. In addition, each grating in the spatial light modulator plane can be moved along the direction perpendicular to the grating line, so that phase shift is introduced in shear interference, and issues such as nonlinear errors of phase shift, pupil detection displacement or field point position deviation arising from phase generation via mechanically moving the gratings are avoided, and measurement precision is improved. The present invention is applicable for aberration detection for immersion lithographic projection lens under large numerical aperture to realize sub-nano and high speed aberration detection.

Compared with prior art, the present invention is advantageous in the following aspects:

1. As compared with current technology, the present invention substitutes the physical gratings on the object plane and the image plane with respectively a spatial light modulator grating, the grating periods and the grating line directions are all adjustable via a computer, and hence the shear direction and shear rate are both adjustable without replacing any component, and the system is thus more flexible. Moreover, as phase shift is generated by means of moving the grating line of the image plane or the object plane spatial light modulator via computer programming, issues such as nonlinear errors of phase shift, pupil detection displacement or field point position deviation arising from phase generation via mechanically moving the gratings are avoided, and measurement precision is improved.

2. As compared with current technology, the present invention substitutes the physical grating on the image plane with a spatial light modulator grating, and in cooperation with an object plane spatial light modulator grating, renders the shear ratio and shear direction of the detection system adjustable without replacing any component, thereby avoid the mechanical movement and increases the flexibility and precision of the system. In addition, in comparison with U.S. Patent Application Publication 2006/0001890 A1, the present invention is advantageous in that multiple field points can be detected in parallel.

DETAILED DESCRIPTION OF THE INVENTION AND EMBODIMENTS

In combination with embodiments and drawings hereunder provided, the present invention is further expounded, but is not meant to be restricted thereby.

Figure 1:
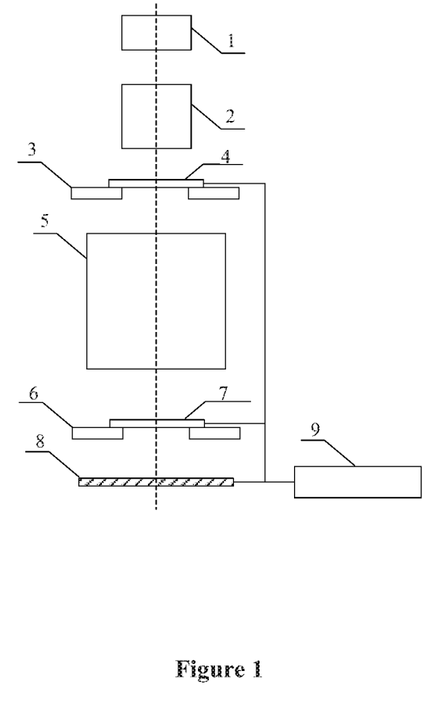
FIG. 1 is a schematic diagram of the multi field point aberration parallel detection device for a lithographic projection lens of the present invention.

First, as shown in FIG. 1, the multi field point aberration parallel detection device for a lithographic projection lens of the present invention comprises:

a light source 1 and an illumination system 2, a reticle stage 3, a wafer stage 6 and a two-dimensional photodetector 8 disposed successively along an optical route of the light source 1; its characteristics is that an object plane spatial light modulator 4 is arranged on the reticle stage 3 which moves the object plane spatial light modulator 4 along therewith; an image plane spatial light modulator 7 is arranged on the wafer stage 6 which moves the image plane spatial light modulator 7 along therewith; the object plane spatial light modulator 4, the image plane spatial light modulator 7, and the two-dimensional photodetector 8 are respectively connected with a computer 9; the object plane spatial light modulator 4 is disposed by the computer 9 as an object plane grating set comprising n object plane gratings, wherein n is a positive integer representing the number of the parallel detection field points; the image plane spatial light modulator 7 is disposed by the computer 9 as an image plane grating set comprising n image plane gratings; wherein the object plane gratings in the object plane grating set are one-dimensional gratings, the image plane gratings in the image plane grating set are two-dimensional chessboard gratings or two-dimensional cross gratings. The object plane spatial light modulator and the image plane spatial light modulator are either a transmissive amplitude-only spatial light modulator or a transmissive phase spatial light modulator.

Figure 2:
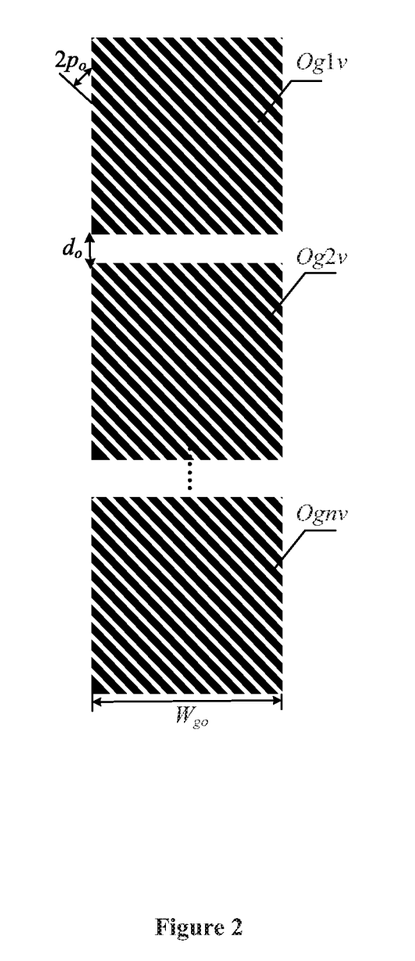
FIG. 2 is a schematic diagram showing disposal of an object plane spatial light modulator as a one-dimensional grating set with a grating line direction v via computer programming in the first embodiment of the present invention for shear measuring along direction u.

In the first embodiment of the present invention, the grating line direction of the object plane gratings of the object plane grating set is directed along a v direction and a u direction, for shear measuring along the respective directions. As shown in FIG. 2, for shear measuring in the u direction, the grating line direction of the object plane gratings of the object plane grating set is directed along the v direction.

Figure 3:
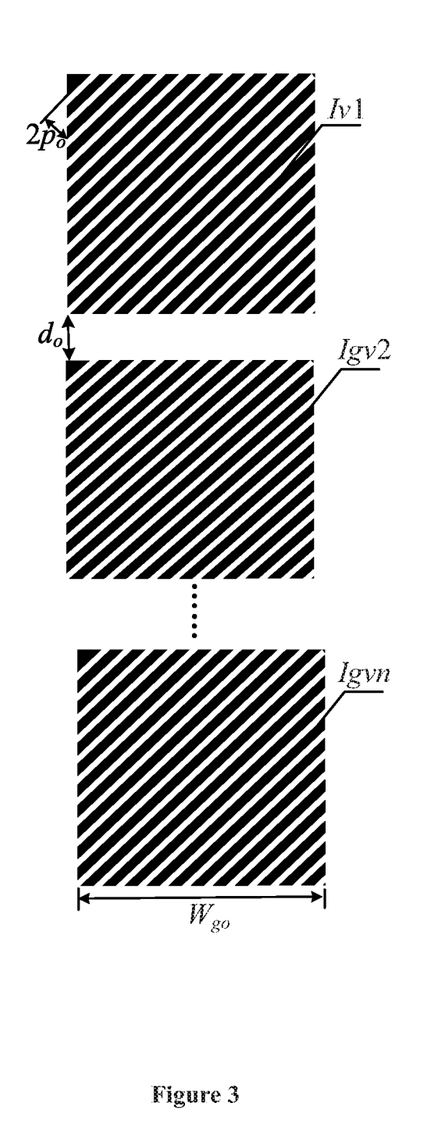
FIG. 3 is a schematic diagram showing disposal of an object plane spatial light modulator as a one-dimensional grating set with a grating line direction u via computer programming in the first embodiment of the present invention for shear measuring along direction v.

As shown in FIG. 3, for shear measuring in the v direction, the grating line direction of the object plane gratings of the object plane grating set is directed along the u direction.

Figure 4:
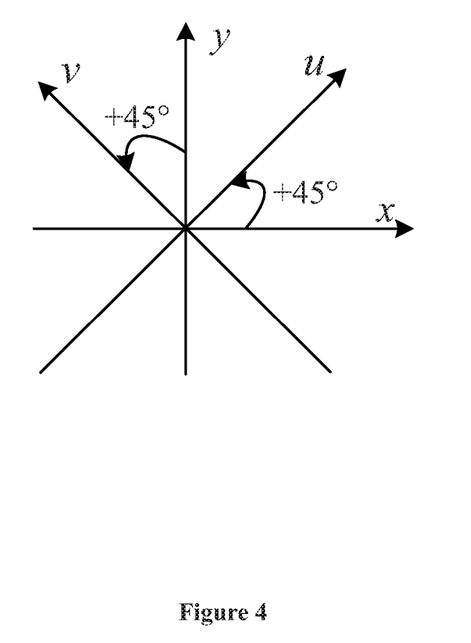
FIG. 4 is a schematic diagram depicting relations among the shear measuring directions of the u direction, the v direction, and the x direction and y direction of the coordinate system of a lithographic tool.

As shown in FIG. 4, the u direction is in a +45° angle to the x direction, the v direction is in a +45° angle to the y direction, wherein the counter-clockwise direction is defined by the present invention as positive, the x direction and the y direction are two orthogonal directions in the coordinate system of a lithographic tool, and the lengthwise direction of the scanning slit of the lithographic projection lens is identical to the y direction.

Figure 5:
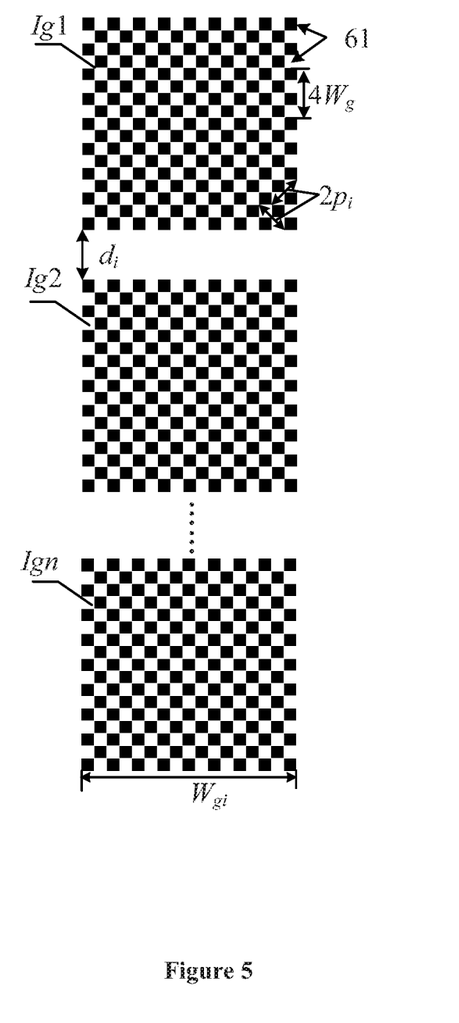
FIG. 5 is a schematic diagram showing disposal of an image plane spatial light modulator as a two-dimensional chessboard grating set via computer programming.

As shown in FIG. 5, the image plane shear gratings in the image plane grating set are two-dimensional chessboard gratings, wherein a chessboard square 61 on a two-dimensional chessboard grating has its diagonal directions as the u direction and the v direction; the ratio of object grating period $p_o$ over image grating period $p_i$ is magnification rate M of the under-test projection lens 5, the ratio of the distance $d_o$ in-between the gratings on the object plane grating set over the distance $d_i$ in-between the gratings on the image plane grating set is the magnification rate of the under-test projection lens 5, the object plane gratings on the object plane grating set and the image plane gratings on the image plane grating set are all disposed in square forms, the ratio of the size of the object plane grating $W_{go}$ over the size of the image plane grating $W_{gi}$ is the magnification rate of the under-test projection lens 5, and the object plane gratings in the object plane grating set and the image plane gratings in the image plane grating set are all arranged along the y direction; in the first embodiment, by means of controlling the object plane spatial light modulator 4 via programming of the computer 9, rotate the grating line direction of the gratings on the object plane grating set by 90°, change the shear direction, and move the grating line of the gratings on the object plane grating set perpendicular to the grating line direction to generate phase shift; the object plane gratings in the object plane grating set and the image plane shear gratings in the image plane grating set are all arranged along the y direction, and n field of view points are parallel detected along the y direction.

In the method of parallel detection for multi field points aberration of a lithographic projection lens employing the afore-mentioned multi field of view point wave aberration parallel detection device for a lithographic projection lens of the present invention, the method comprises the following steps:

(1) adjusting the optical route for detection:

adjusting the reticle stage 3 so that the object plane spatial light modulator 4 thereon is on an object plane of an under-test projection lens 5, and adjusting the wafer stage 6 so that the image plane spatial light modulator 7 thereon is on an image plane of the under-test projection lens 5; adjusting the reticle stage 3 and the wafer stage 6 so that the object plane gratings in the object plane grating set and the image plane gratings in the image plane grating set are in an relation of object and image;

(2) shear measuring:

1) shear measuring in the u direction adjusting the object plane spatial light modulator 4 so that the grating line of the object plane gratings on the object grating set is directed in the v direction; opening the light source 1; detecting shear interferograms corresponding to each image plane shear interference grating on the image plane grating set via the photodetector 8, and transmitting to the computer 9 for storage; adjusting the object plane spatial light modulator 4 so that the grating line of each object plane grating of the object plane grating set moves along the u direction and realizing a phase shift interference; recording a phase shift shear interferogram for each phase shift step, and transmitting to the computer 9 for storage;

2) shear measuring in the v direction adjusting the object plane spatial light modulator 4 so that the grating line of the object plane gratings on the object grating set is directed in the u direction; opening the light source 1; detecting a shear interferogram corresponding to each image plane shear interference grating on the image plane grating set via the photodetector 8, and transmitting to the computer 9 for storage; adjusting the object plane spatial light modulator 4 so that the grating line of each object plane grating of the object plane grating set moves along the v direction and realizing a phase shift interference; recording a phase shift shear interferogram for each phase shift, and transmitting to the computer 9 for storage;

the shear interferogram transmitted to the computer (9) for storage is a data of light intensity, the shear interferogram for each shear measuring direction, for each field point, and for each phase shift is represented by $I_{jkl}$, wherein sub-indexes j, k, and l being positive integers, and representing respectively a jth measuring direction, a kth field point, and an lth phase shift, and $I_{jkl}$ representing a shear interferogram of the jth measuring direction, the kth field point, and the lth phase shift; the value of j is generally 1 or 2, that is, shear measuring is conducted in two mutually perpendicular directions, albeit it might be conducted multiple times in multiple non mutually perpendicular directions in a plane; k ranges from 1-n, and the range of l depends on the adopted phase shift algorithm;

the measuring direction under test is any direction in an xy plane, and has at least two directions, wherein the xy plane is a horizontal plane of a coordinate system of a lithographic tool;

(3) data processing:

obtaining a phase data $\theta_{jk}$ for each field point and each shear direction by means of a phase extracting algorithm on each shear interferogram for each shear direction and each image shear grating via the computer 9, obtaining a aberration data $W_j$ (j=1, 2, . . . , n) for each field point via the phase data for all the shear directions of each field point by means of a wavefront reconstruction algorithm for shear interference, and thus obtaining the aberration data $W_j$ for all the parallel detection field points of the projection lens.

Figure 6:
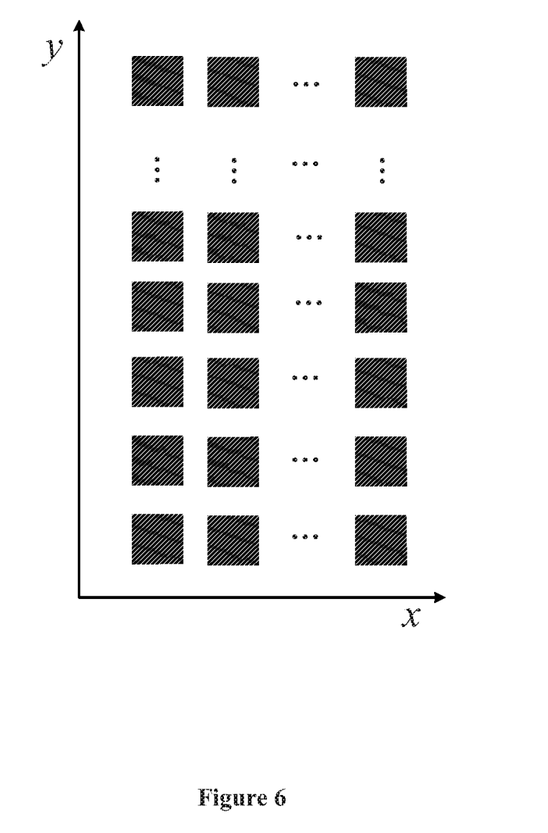
FIG. 6 is a schematic diagram of the second embodiment of the present invention wherein an object plane spatial light modulator is disposed as a one-dimensional object plane grating set arranged two-dimensionally.
Figure 7:
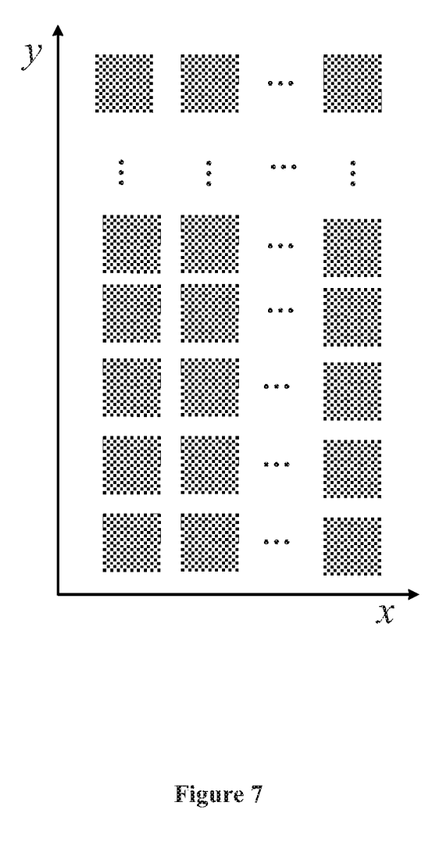
FIG. 7 is a schematic diagram of the second embodiment of the present invention wherein an image plane spatial light modulator is disposed as a two-dimensional image plane shear grating set arranged two-dimensionally.

In the second embodiment of the present invention, the object plane gratings in the object grating set are distributed two-dimensionally, as is shown on FIG. 6, wherein $n_y$ gratings are arranged in the y direction, $n_x$ gratings are arranged in the x direction, with the number of gratings being $n_x \times n_y$; the image plane gratings in the image plane grating set are also distributed two-dimensionally, as is shown on FIG. 7, wherein $n_y$ gratings are arranged in the y direction, $n_x$ gratings are arranged in the x direction, with the number of gratings being $n_x \times n_y$; the object plane gratings in the object plane grating set and the image plane gratings in the image plane grating set are in an object-image relationship in respect of the projection lens 5; the grating period, the grating size and the distance in-between the gratings in the object plane grating set are in a ratio of magnification rate M of the projection lens 5 over respectively the grating period, the grating size and the distance in-between the gratings in the image plane grating set; the object plane gratings in the object plane grating set are one-dimensional, the image plane shear gratings in the image plane grating set are two-dimensional chessboard gratings, and the number of realizable parallel detection field points are $n=n_x \times n_y$.

The method of parallel detection for multi field point aberration of a lithographic projection lens employing the afore-mentioned multi field point aberration parallel detection device for a lithographic projection lens comprises the following steps:

(1) adjusting the optical route for detection:

adjusting the reticle stage 3 so that the object plane spatial light modulator 4 thereon is on an object plane of an under-test projection lens 5, and adjusting the wafer stage 6 so that the image plane spatial light modulator 7 thereon is on an image plane of the under-test projection lens 5; adjusting the reticle stage 3 and the wafer stage 6 so that the object plane gratings in the object plane grating set and the image plane gratings in the image plane grating set are in an relation of object and image;

(2) shear measuring:

1) shear measuring in the u direction adjusting the object plane spatial light modulator 4 so that the grating line of the object plane gratings on the object grating set is directed in the v direction; opening the light source 1; detecting shear interferogram corresponding to each image plane shear interference grating on the image plane grating set via the photodetector 8, and transmitting to the computer 9 for storage; adjusting the object plane spatial light modulator 4 so that the grating line of each object plane grating of the object plane grating set moves along the u direction and realizing a phase shift interference; recording a phase shift shear interferogram for each phase shift, and transmitting to the computer 9 for storage;

2) shear measuring in the v direction adjusting the object plane spatial light modulator 4 so that the grating line of the object plane gratings on the object grating set is directed in the u direction; opening the light source 1; detecting shear interferogram corresponding to each image plane shear interference grating on the image plane grating set via the photodetector 8; and transmitting to the computer 9 for storage, adjusting the object plane spatial light modulator 4 so that the grating line of each object plane grating of the object plane grating set moves along the v direction and realizing a phase shift interference; recording a phase shift shear interferogram for each phase shift, and transmitting to the computer 9 for storage;

the shear interferogram transmitted to the computer (9) for storage is a data of light intensity, the shear interferogram for each shear measuring direction, for each field point, and for each phase shift is represented by $I_{jkl}$, wherein subindexes j, k, and l being positive integers, and representing respectively a jth measuring direction, a kth field point, and an lth phase shift, and $I_{jkl}$ representing a shear interferogram of the jth measuring direction, the kth field point, and the lth phase shift; the value of j is generally 1 or 2, that is, shear measuring is conducted in two mutually perpendicular directions, albeit it might be conducted multiple times in multiple non mutually perpendicular directions in a plane; k ranges from 1-n, and the range of l depends on the adopted phase shift algorithm;

the measuring direction under test is any direction in an xy plane, and has at least two directions, wherein the xy plane is a horizontal plane of a coordinate system of a lithographic tool;

(3) data processing:

obtaining a phase data $\theta_{jk}$ for each field point and each shear direction by means of a phase extracting algorithm on each shear interferogram for each shear direction and each image shear grating via the computer 9, obtaining a aberration data $W_j$ (j=1, 2, ..., n) for each field point via the phase data for all the shear directions of each field point by means of a wavefront reconstruction algorithm for shear interference, and thus obtaining the aberration data for all the parallel detection field points of the projection lens.

In comparison with current technology, the present invention adopts both on the object plane and the image plane a spatial light modulator as an optical field modulating component, realizes adjustment of phase shift, shear ratio, and changing of shear direction with no mechanical movement and without replacing any component; the system is flexible;

no deviation of the pupil position or the position of the field points will take place in measuring, and thus the measuring precision is higher.

In the present invention, via computer programming, the period and the grating line direction of the object plane grating and the image plane grating can be controlled, change of shear direction and adjustment of shear ratio are realized without replacing or mechanically moving any component, and thus system flexibility is enhanced; phase shift is realized by means of controlling grating line movement of the object plane grating or the image plane grating via computer programming, thus the problem of pupil position displacement or field point position deviation arising from phase shift via mechanically moving the gratings is avoided, and measurement precision is improved.

We claim:

1. A multi field point aberration parallel detection device for a lithographic projection lens, comprising:

a light source and an illumination system, a reticle stage, a wafer stage, a two-dimensional photodetector disposed successively along an optical route of the light source, an object plane spatial light modulator being arranged on the reticle stage and moving along therewith, an image plane spatial light modulator being arranged on the wafer stage and moving the along therewith, wherein the object plane spatial light modulator, the image plane spatial light modulator and the two-dimensional photodetector are respectively connected with a computer; the object plane spatial light modulator is disposed by the computer as an object plane grating set comprising n object plane gratings, and n is a positive integer representing a number of the parallel detection field of view points; the image plane spatial light modulator is disposed by the computer as an image plane grating set comprising n image plane gratings; the object plane gratings in the object plane grating set are one-dimensional gratings, the image plane gratings in the image plane grating set are two-dimensional chessboard gratings or two-dimensional cross gratings, and the object plane gratings in the object plane grating set are arranged in an identical manner as the image plane gratings are in the image plane grating set.

2. The multi field point aberration parallel detection device for a lithographic projection lens according to claim 1, wherein the object plane spatial light modulator and the image plane spatial light modulator are either transmissive amplitude-only spatial light modulators or transmissive phase spatial light modulators.

3. The multi field point aberration parallel detection device for the lithographic projection lens according to claim 1, wherein the object plane gratings in the object plane grating set and the image plane gratings in the image plane grating set are arranged one dimensionally in an line, or are arranged two dimensionally along two perpendicular directions in a plane.

4. A method for parallel detection of a multi field point aberration parallel detection device for the lithographic projection lens of claim 1, comprising adjusting an optical route for detection by adjusting the reticle stage so that the object plane spatial light modulator thereon is on an object plane of an under-test projection lens, and adjusting the wafer stage so that the image plane spatial light modulator thereon is on an image plane of the under-test projection lens; adjusting the reticle stage and the wafer stage so that the object plane gratings in the object plane grating set and the image plane gratings in the image plane grating set are in an relation of object and image;

shear measuring by adjusting the object plane gratings in the object plane grating set via the computer so that a direction of a grating line of the object plane gratings is perpendicular to a shear measuring direction under test; opening the light source; detecting a shear interferogram corresponding to each image plane shear interference grating on the image plane grating set via the photodetector, and transmitting to the computer for storage; adjusting via the computer so that the grating line of the object plane gratings of the object plane grating set or of the image plane gratings of the image plane grating set generates a phase shift $\phi_1$ along a measuring direction under test, wherein $\phi_1$ representing a phase shift quantity for a first phase shift; detecting via the photodetector, and transmitting to the computer for storage for each phase shift a shear interferogram corresponding to each image plane grating;

the shear interferogram transmitted to the computer for storage is a data of light intensity, the shear interferogram for each shear measuring direction, for each field point, and for each phase shift is represented by $I_{jkl}$, wherein sub-indexes j, k, and l being positive integers, and representing respectively a jth measuring direction, a kth field point, and an lth phase shift, and $I_{jkl}$ representing a shear interferogram of the jth measuring direction, the kth field point, and the lth phase shift;

the measuring direction under test is any direction in an xy plane, and has at least two directions, wherein the xy plane is a horizontal plane of a coordinate system of a lithographic tool; and processing data by obtaining a phase data $\theta_{jk}$ for each field point and each shear direction by means of a phase extracting algorithm on each shear interferogram for each shear direction and each image shear grating via the computer, obtaining a aberration data $W_j$ (j=1, 2, ..., n) for each field point via the phase data for all the shear directions of each field point by means of a wavefront reconstruction algorithm for shear interference, and thus obtaining the wave aberration data $W_j$ for all the parallel detection field points of the projection lens.

\* \* \* \* \*